US012684893B2

(12) United States Patent
Kammler et al.

(10) Patent No.: US 12,684,893 B2
(45) Date of Patent: Jul. 14, 2026

(54) REFLECTIVE SEMICONDUCTOR DEVICE WITH MIRROR ELEMENTS HAVING TWO OXIDE LAYERS OVER ALUMINUM LAYER, AND RELATED METHOD

(71) Applicant: GlobalFoundries Dresden Module One Limited Liability Company & Co. KG, Dresden (DE)

(72) Inventors: Thorsten E. Kammler, Dresden (DE); Robert Viktor Seidel, Dresden (DE); Michael Grillberger, Radebeul (DE); Oliver Witnik, Dresden (DE); Nicole Brach, Dresden (DE); Raghav Shankar Uma Sankar, Dresden (DE)

(73) Assignee: GLOBALFOUNDRIES DRESDEN MODULE ONE LIMITED LIABILITY COMPANY & CO. KG, Dresden (DE)

( * ) Notice: Subject to any disclaimer, the term of this patent is extended or adjusted under 35 U.S.C. 154(b) by 799 days.

(21) Appl. No.: 17/806,321

(22) Filed: Jun. 10, 2022

(65) Prior Publication Data

US 2023/0402555 A1 Dec. 14, 2023

(51) Int. Cl.
*H10F 77/40* (2025.01)
*G02B 5/20* (2006.01)
*H10F 77/30* (2025.01)

(52) U.S. Cl.
CPC ......... *H10F 77/413* (2025.01); *H10F 77/306* (2025.01); *G02B 5/207* (2013.01)

(58) Field of Classification Search
CPC ............ H10F 77/413; G02F 1/133553; G02F 1/133555; G02F 1/13439; G02F 1/136277
See application file for complete search history.

(56) References Cited

U.S. PATENT DOCUMENTS

| | | | | | |
|---|---|---|---|---|---|
| 5,869,394 | A | * | 2/1999 | Chen | H10W 20/071 |
| | | | | | 438/631 |
| 6,037,251 | A | * | 3/2000 | Tu | H10P 76/2043 |
| | | | | | 438/626 |

(Continued)

FOREIGN PATENT DOCUMENTS

| | | |
|---|---|---|
| CN | 101398579 A | 4/2009 |
| CN | 101587859 A | 11/2009 |

(Continued)

OTHER PUBLICATIONS

CN Patent Application No. 202310556284.1, Office Action mailed Dec. 12, 2025, 10 pages.

*Primary Examiner* — Raj R Gupta
(74) *Attorney, Agent, or Firm* — Francois Pagette; Hoffman Warnick LLC

(57) ABSTRACT

A reflective semiconductor device includes an integrated circuit (IC) structure, and a pair of mirror elements over the IC structure. The pair of mirror elements are separated by a trench. Each mirror element includes a mirror layer of, for example, aluminum, on the IC structure, and a low temperature oxide (LTO) layer on the mirror layer. A high temperature oxide (HTO) layer is over the pair of mirror elements and fills the trench. A liquid crystal layer over the mirror elements provides a liquid crystal on semiconductor (LCOS) device. The two-oxide layer prevents mirror layer creep and/or agglomeration during formation of the HTO layer and provide a suitable surface for LCOS assembly without using specialized alloys.

13 Claims, 5 Drawing Sheets

(56) References Cited

U.S. PATENT DOCUMENTS

| | | | | |
|---|---|---|---|---|
| 7,645,703 | B2 | 1/2010 | Yu et al. | |
| 7,863,145 | B2* | 1/2011 | Xiang | G02F 1/133553 |
| | | | | 438/362 |
| 7,872,722 | B2 | 1/2011 | Kimura | |
| 9,829,761 | B2* | 11/2017 | Kimura | H04N 9/3102 |
| 9,831,238 | B2* | 11/2017 | Yamazaki | H10D 88/00 |
| 10,739,646 | B1 | 8/2020 | Zhang et al. | |
| 2009/0323005 | A1* | 12/2009 | Ota | G02F 1/13439 |
| | | | | 349/143 |
| 2016/0246115 | A1* | 8/2016 | Fan | G02F 1/133553 |
| 2019/0250439 | A1* | 8/2019 | Urey | G02F 1/133553 |
| 2020/0249536 | A1* | 8/2020 | Fan | G02F 1/136277 |

FOREIGN PATENT DOCUMENTS

| | | |
|---|---|---|
| CN | 104517831 A | 4/2015 |
| KR | 100595854 B1 | 6/2006 |
| TW | 411517 B | 11/2000 |

\* cited by examiner

REFLECTIVE SEMICONDUCTOR DEVICE WITH MIRROR ELEMENTS HAVING TWO OXIDE LAYERS OVER ALUMINUM LAYER, AND RELATED METHOD

BACKGROUND

The present disclosure relates to reflective semiconductor devices, and more particularly, to a reflective semiconductor device including mirror elements having a low temperature oxide layer over a mirror layer, and a high temperature oxide layer over the mirror elements and filling trenches therebetween.

Reflective semiconductor devices are used in liquid crystal on semiconductor (LCOS) technology, which is used in a number of applications such as illumination, switching, and near-field displays. LCOS technology uses a liquid crystal layer over a silicon backplane. In a display, LCOS provides an active-matrix liquid-crystal display in which an integrated circuit control logic controls a voltage on a reflective mirror element (e.g., aluminum electrode) below a chip surface, i.e., for one pixel. The aluminum mirror elements are separated by small trenches. A smooth coverage with a thin oxide layer provides a suitable surface for the LCOS assembly. High temperature oxides are used to fill the trenches and provide local planarization. The high temperature oxides may cause defects in the aluminum due to temperature-related surface creep and/or agglomeration. Current approaches use specialized aluminum alloys for the mirrors including high amounts of, for example, copper or silicon, to suppress the oxide creep, but this approach has limited efficacy.

SUMMARY

An aspect of the disclosure is directed to a reflective semiconductor device, comprising: an integrated circuit (IC) structure; a pair of mirror elements over the IC structure, the pair of mirror elements separated by a trench, each mirror element including: a mirror layer on the IC structure, and a low temperature oxide (LTO) layer on the aluminum layer; and a high temperature oxide (HTO) layer over the pair of mirror elements and filling the trench.

Another aspect of the disclosure includes a reflective semiconductor device, comprising: an integrated circuit (IC) structure; a pair of mirror elements over the IC structure, the pair of mirror elements separated by a trench, each mirror element including: an aluminum layer on the IC structure, and a low temperature oxide (LTO) layer over the aluminum layer; and a high temperature oxide (HTO) layer over the pair of mirror elements and filling the trench, wherein sidewalls of the LTO layer are aligned with sidewalls of the aluminum layer, and the HTO layer abuts the sidewalls of the LTO layer and the aluminum layer, and wherein a surface of the HTO layer deviates no greater than 10 nanometers over the LTO layer versus in the trench between the pair of mirror elements.

Another aspect of the disclosure is directed to a method, comprising: forming an aluminum layer over an integrated circuit (IC) structure; forming a low temperature oxide (LTO) layer over the aluminum layer; patterning the aluminum layer and the LTO layer into a pair of mirror elements separated by a trench; forming a high temperature oxide (HTO) layer over the pair of mirror elements and filling the trench; and planarizing the HTO layer.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

Figure 1:
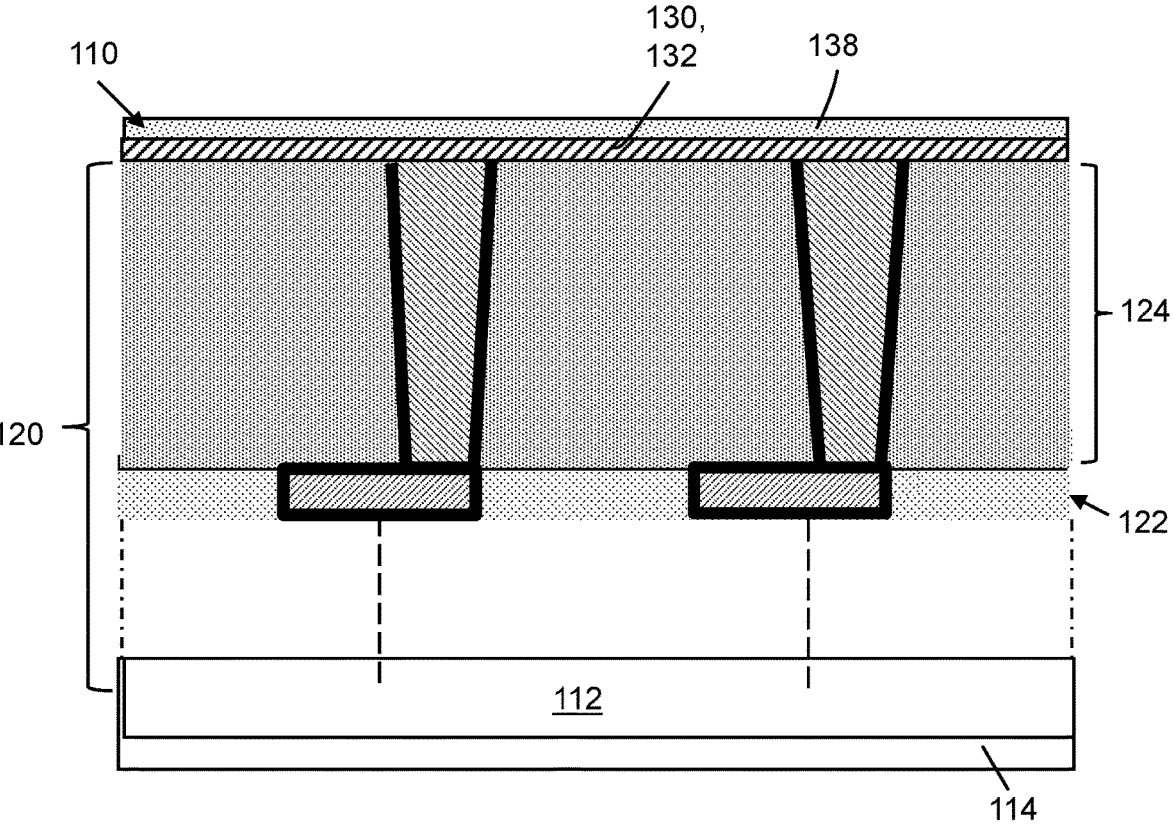
FIG. 1 shows a cross-sectional view of an initial structure for a method including a mirror layer and an LTO layer over an IC structure, according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure provide a reflective semiconductor device including an integrated circuit (IC) structure, and a pair of mirror elements over the IC structure. The pair of mirror elements are separated by a trench. Each mirror element includes a mirror layer, such as aluminum, on the IC structure, and a low temperature oxide (LTO) layer on the mirror layer. A high temperature oxide (HTO) layer is over the pair of mirror elements and fills the trench. A liquid crystal layer over the mirror elements provides a liquid crystal on semiconductor (LCOS) device. The two-oxide layer prevents aluminum creep and/or agglomeration during formation of the HTO layer and provide a suitable surface for LCOS assembly without using specialized aluminum alloys.

FIGS. 1-6 show cross-sectional views of a method of forming a reflective semiconductor device 100 (FIG. 6), according to embodiments of the disclosure. FIG. 1 shows an initial structure 110 including an integrated circuit (IC) structure 112. Parts of IC structure 112 are in a semiconductor layer 114. IC structure 112 may include any now known or later developed electric circuitry appropriate for the application of reflective semiconductor device 100 (FIG. 6) (hereinafter "device 100" for brevity). For example, for a display application, IC structure 112 would include logic controls for operating the various devices 100 that would form pixels of the display. Semiconductor layer 114 may include any now known or later developed semiconductor material, e.g., silicon, silicon germanium, silicon carbide, etc. As understood, device 100 and, more particularly, IC structure 112 scales vertically using a stack 120 of interconnect layers of metal or contacts in dielectric layers (shown in part by dashed lines). A last metal layer 122 and last contact layer 124 of stack 120 are shown in an enlarged manner. Mirror elements 140 (FIGS. 3-6) of device 100 are operatively coupled to IC structure 112 by way of stack 120 of interconnect layers, including last metal layer 122 and last contact layer 124. Metal layer 122 may include metal wires, e.g., copper or aluminum, and contact layer 124 may include metal contacts, e.g., tungsten, within respective dielectric materials.

FIG. 1 also shows forming a mirror layer 130 over IC structure 112. In certain embodiments of the disclosure, mirror layer 130 may include an aluminum layer 132. Aluminum layer 132 is not an alloy, and includes mostly pure aluminum, e.g., >99% by weight. In other embodiments, mirror layer 130 may include silver or gold. Mirror layer 130 is formed by deposition such as but not limited to physical vapor deposition (PVD) or metal-organic chemical vapor deposition (MOCVD). Mirror layer 130 is not formed through a damascene approach, e.g., with trenches formed in dielectric and filled with the material via electroplating or the like. In certain embodiments, mirror layer 130 (e.g., aluminum layer 132) may have a thickness of no greater than 50 nanometers (nm); however, other thicknesses are also possible. An aluminum layer 132 may have a root mean square surface roughness of no greater than 5 nanometers, which is protected and maintained by using the two-oxide layers, as described herein.

FIG. 1 also shows forming a low temperature oxide (LTO) layer 138 over mirror layer 130, e.g., over aluminum layer 132. LTO layer 138 may be formed by any now known or later developed low temperature oxide formation technique, prior to patterning mirror layer 130. For example, LTO layer 138 may be formed using a CVD process using a silane (SiH$_4$) precursor, and a deposition temperature in a range of approximately 170-230° Celsius, e.g., approximately 200° C. LTO layer 138 thus includes a silane-based silicon oxide (SiO$_2$).

Figure 2:
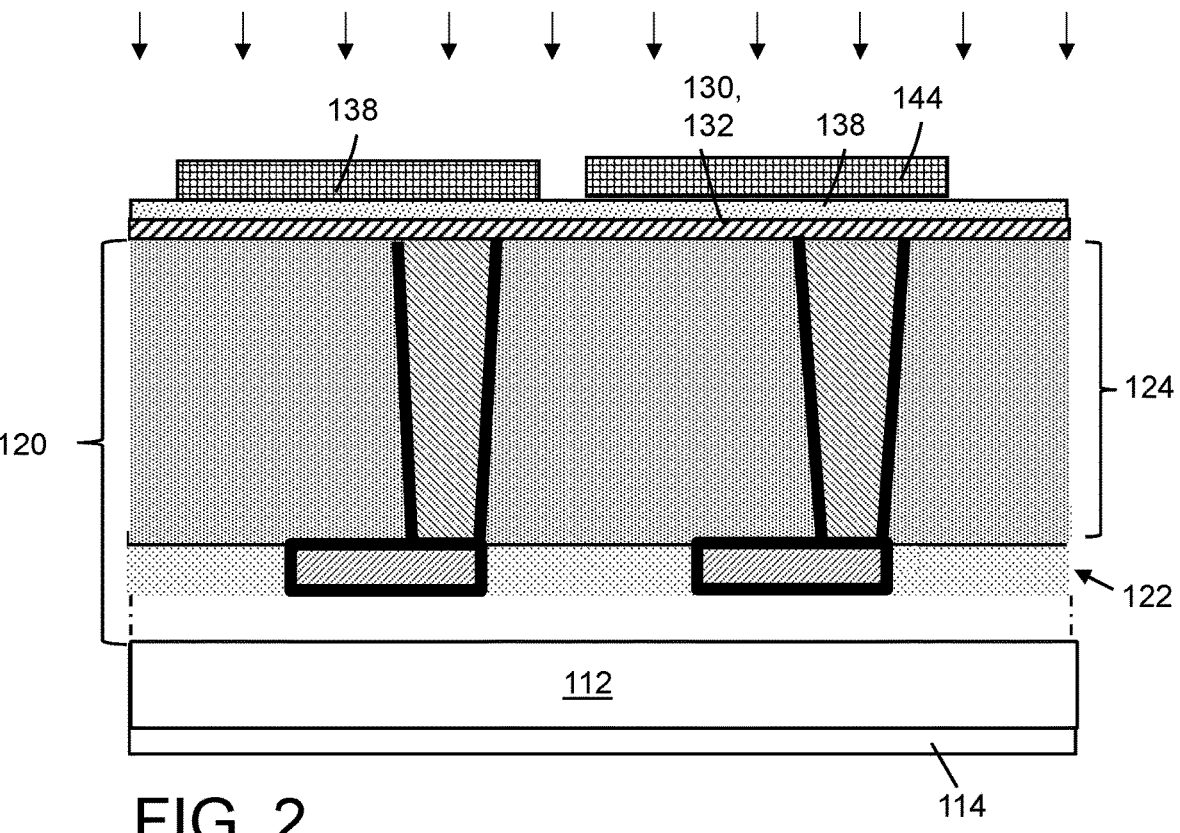
FIG. 2 shows a cross-sectional view of a mask for patterning the LTO layer and the mirror layer, according to embodiments of the disclosure.
Figure 3:
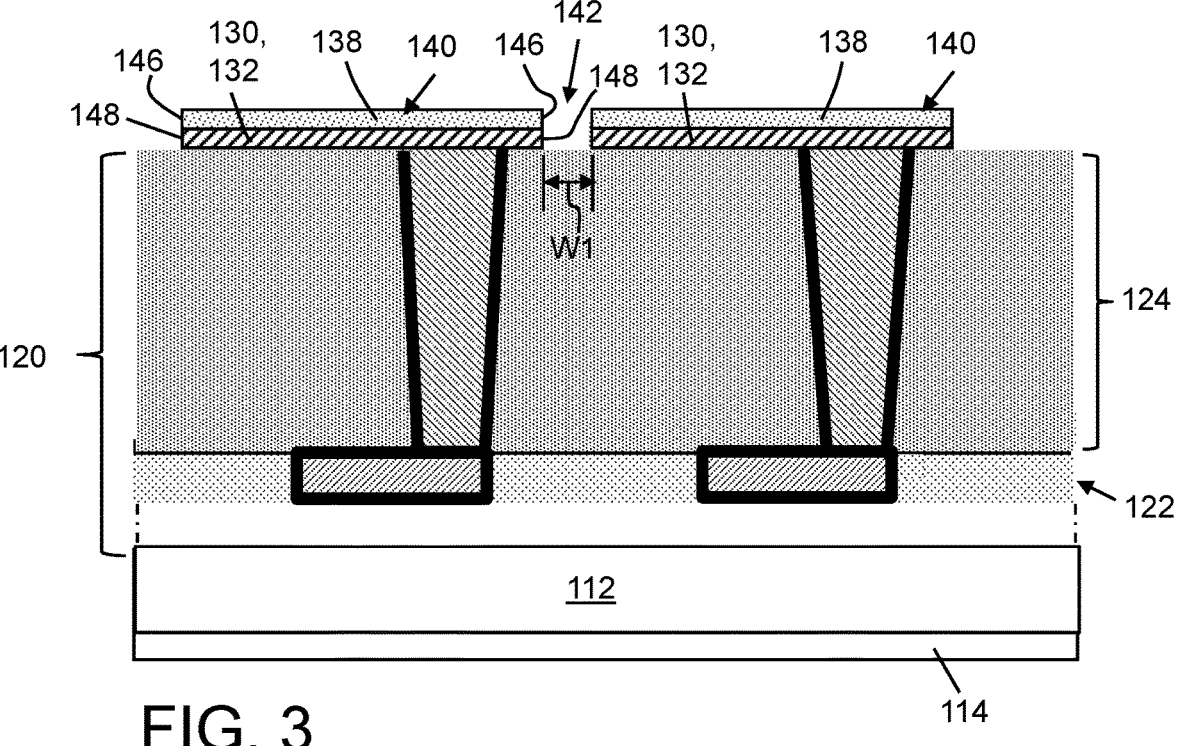
FIG. 3 shows a cross-sectional view of the LTO layer and the mirror layer after patterning into a pair of mirror elements, according to embodiments of the disclosure.

FIGS. 2-3 show cross-sectional views of patterning mirror layer 130, e.g., aluminum layer 132, and LTO layer 138 into a pair of mirror elements 140 (FIG. 3) separated by a trench 142. While a pair of mirror elements 140 are shown, it will be recognized that a much larger number of mirror elements 140 are typically formed in an array in this process for most applications. For example, for a display, a mirror element would be formed for each pixel, which can be in the millions for high-definition displays. This process can be carried out by forming a mask 144 over LTO layer 138 and mirror layer 130, patterning mask 144, and etching LTO layer 138 and mirror layer 130. Mask 144 may include any appropriate masking material for layers 130, 138. Common masking materials are photoresist (resist) and nitride. Nitride is usually considered to be a "hard mask." Mask may include a developable organic planarization layer (OPL) on the layer to be etched, a developable anti-reflective coating (ARC) layer on the developable OPL, and a photoresist mask layer on the developable ARC layer. The etching process may include any appropriate etching chemistry for layers 130, 138. In one non-limiting example, the etching may include a reactive ion etching (RIE) process.

FIG. 3 shows the structure after removal of mask 144. Mask 144 may be removed using any known removal process appropriate for the mask material, e.g., a wet etch for hard nitride mask or an ashing process (oxygen dry strip process) for a soft resist-based mask. Each mirror element 140 includes mirror layer 130 on IC structure 112 and LTO layer 138 on mirror layer 130, e.g., aluminum layer 132. Due to the contemporaneous formation, LTO layer 138 has sidewalls 146 aligned with sidewalls 148 of mirror layer 130. In certain embodiments, trench 142 may have a width W1 of no greater than 100 nm. For example, in certain embodiments, trench 142 may have a width W1 as small as 53 nm.

Figure 4:
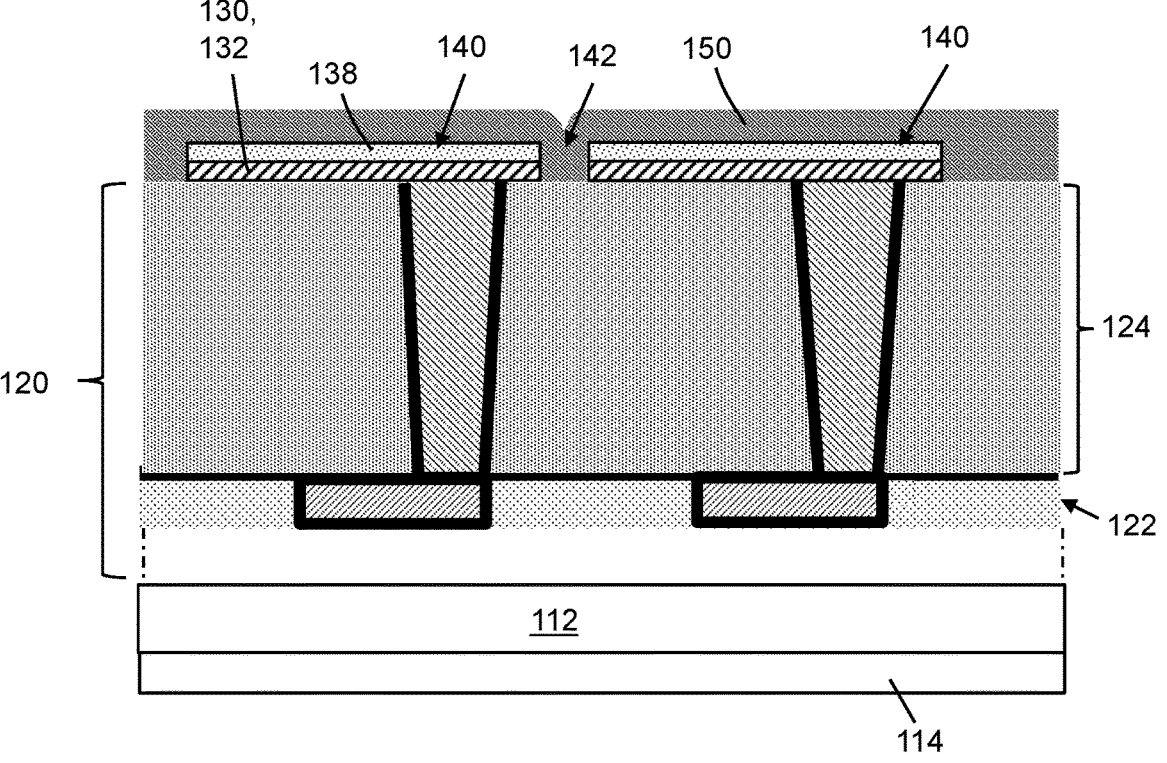
FIG. 4 shows a cross-sectional view of forming an HTO layer over and between the pair of mirror elements, according to embodiments of the disclosure.

FIG. 4 shows a cross-sectional view of forming a high temperature oxide (HTO) layer 150 over pair of mirror elements 140 and filling trench 142 (FIG. 3). HTO layer 150 may be formed by any now known or later developed high temperature oxide formation technique. For example, HTO layer 150 may be formed using a CVD process using a tetraethyl orthosilicate (TEOS) precursor, and a deposition temperature of approximately 350-480° C., e.g., 415° C. HTO layer 150 thus includes a TEOS-based silicon oxide (SiO$_2$). Because HTO layer 150 fills trench 142, HTO layer 150 abuts sidewalls 146, 148 of LTO layer 138 and mirror layer 130 (e.g., aluminum layer 132), respectively.

Figure 5:
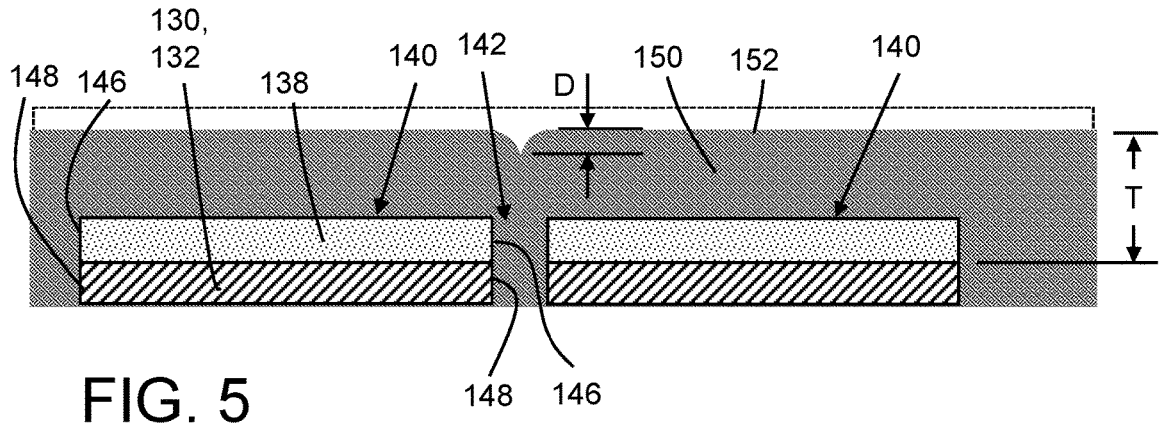
FIG. 5 shows an enlarged cross-sectional view of the HTO layer over the pair of mirror elements, according to embodiments of the disclosure.
Figure 6:
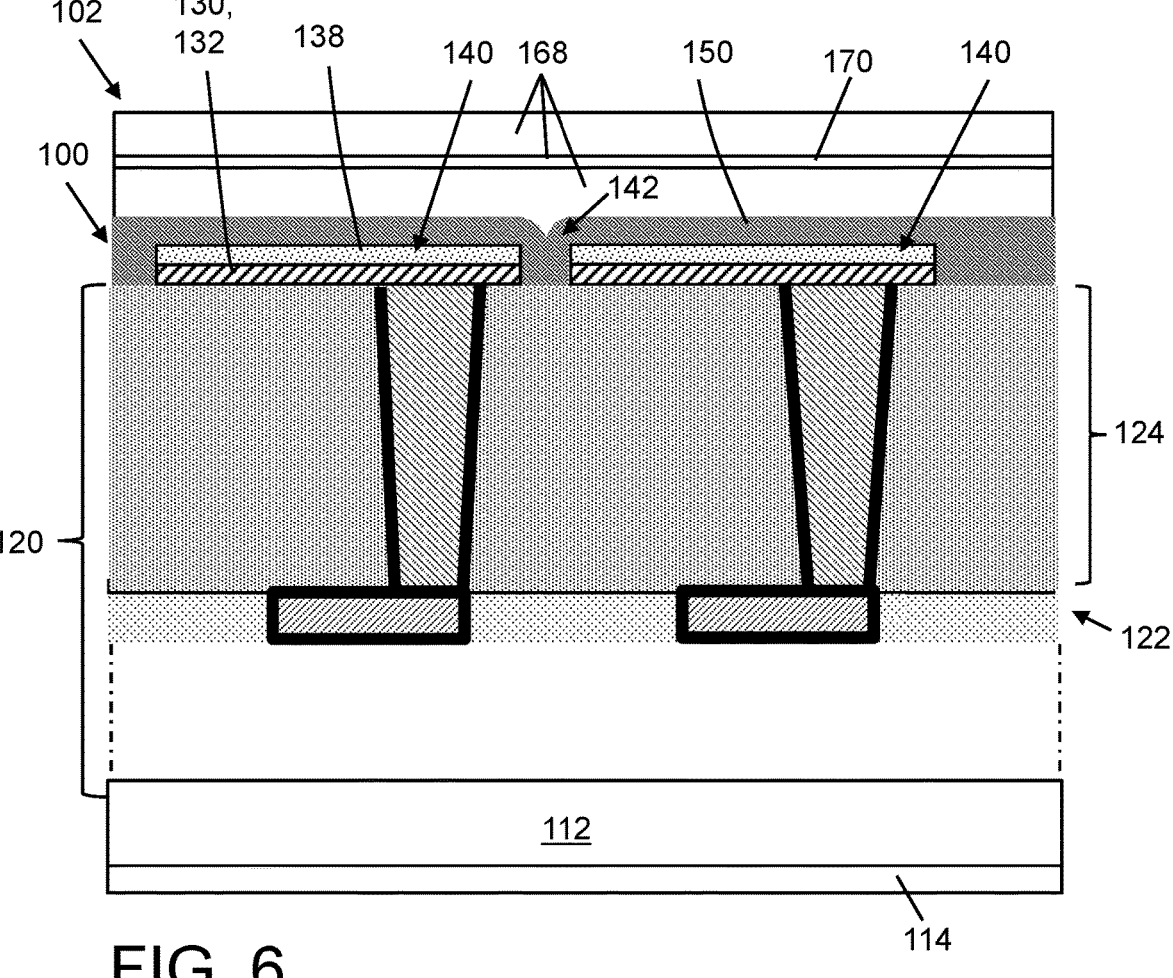
FIG. 6 shows a cross-sectional view of a reflective semiconductor device and LCOS device, according to embodiments of the disclosure.

FIG. 5 shows an enlarged cross-sectional view of mirror elements 140 with HTO layer 150 after planarizing HTO layer 150. Planarizing may include any now known or later developed planarization technique, such as but not limited to chemical mechanical planarization (CMP). Planarization smooths a surface of HTO layer 150. If desired, an optional removing step can be carried out to further refine a thickness of HTO layer 150. For example, a portion of HTO layer 150 (dashed box) may be removed using any appropriate oxide etch back process, after the planarizing in FIG. 5. In certain embodiments, LTO layer 138 and HTO layer 150 have a cumulative thickness T of no greater than 100 nm over mirror layer 130 (e.g., aluminum layer 132). During the high temperature formation of HTO layer 150, LTO layer 138 protects mirror layer 130 from creep and agglomeration. A surface 152 of HTO layer 150 is relatively smooth to allow forming of additional layers 168, including a liquid crystal layer 170 (FIG. 6), thereon for creating a liquid crystal on semiconductor (LCOS) device 102 (FIG. 6). In certain embodiments, surface 152 deviates no greater than a distance D (e.g., 10 nm) over LTO layer 138 versus in trench 142 between pair of mirror elements 140. Any deviation in surface 152 caused by filling of trench 142 by HTO layer 150 is minimized, providing a smooth surface for LCOS assembly. In addition, because LTO layer 138 protects mirror layer 138 during HTO layer 150 formation, mirror layer 130 may have a root mean square (RMS) surface roughness of no greater than 50 Å in device 100 (FIG. 6).

FIG. 6 shows a cross-sectional view of forming a number of additional layers 168 over HTO layer 150 to form device 100 and/or LCOS device 102. In various embodiments, additional layers 168 may include but are not limited to: a transparent protective cover layer, liquid crystal layer 170, alignment layers (e.g., a top alignment layer and a bottom alignment layer), transparent electrode layers, a glass substrate with anti-reflective coatings, polarization layers (e.g., polarizer and analyzer, or polarizing beam splitter layers), as desired to create an LCOS device 102 in accordance with the embodiments of the disclosure. Additional layers 168 may be formed using any appropriate deposition techniques.

As shown in FIG. 6, reflective semiconductor device 100 includes pair of mirror elements 140 over IC structure 112. Pair of mirror elements 140 are separated by trench 142 (filled by HTO layer 150). In certain embodiments, trench 142 may have a width W1 of no greater than 100 nm. For example, in certain embodiments, trench 142 may have a width W1 as small as 53 nm. Hence, mirror elements 140 have width W1 therebetween. Mirror elements 140 of device 100 may include mirror layer 130 on IC structure 112. In certain embodiments, mirror layer 130 may include an aluminum layer 132. As noted, aluminum layer 132 is not an alloy, and includes mostly pure aluminum, e.g., >99% by weight. In other embodiments, mirror layer 130 may include silver or gold. In certain embodiments, mirror layer 130 (e.g., aluminum layer 132) may have a thickness of no greater than 50 nanometers; however, other thicknesses are also possible. Mirror layer 130 may have a root mean square (RMS) surface roughness of no greater than 50 Angstroms.

Mirror elements 140 may also include LTO layer 138 on mirror layer 130. LTO layer may include a silane-based silicon oxide ($SiO_2$). LTO layer 138 has sidewalls 146 aligned with sidewalls 148 of mirror layer 130.

Device 100 also may include HTO layer 150 over pair of mirror elements 140 and filling trench 142. HTO layer 150 may include TEOS-based silicon oxide ($SiO_2$). In certain embodiments, LTO layer 138 and HTO layer 150 have a cumulative thickness T of no greater than 100 nm over mirror layer 130 (e.g., aluminum layer 132). As noted, during the high temperature formation of HTO layer 150, LTO layer 138 protects mirror layer 130 from creep and agglomeration. In certain embodiments, surface 152 deviates no greater than distance D (e.g., approximately 10 nm) over LTO layer 138 versus in trench 142 between pair of mirror elements 140. Because HTO layer 150 fills trench 142, HTO layer 150 abuts sidewalls 146, 148 of LTO layer 138 and mirror layer 130 (e.g., aluminum layer 132), respectively. FIG. 6 also shows device 100 including additional layers 168 of an LCOS assembly. These layers may vary depending on type of device and manufacturer. In one non-limiting example the layers (not all shown) may include: an orientation or alignment layer, a liquid crystal layer 170, another alignment layer, a top electrode layer (of, for example, a transparent conductive oxide), and a glass layer, disposed over pair of mirror elements 140. Other layers may include other transparent protective cover layers, alignment layers for liquid crystal alignment, transparent electrode layers, anti-reflective coatings, glass substrates, polarization layers, or similar layers as needed to create an LCOS device 102. In this manner, reflective semiconductor device 100 can be an LCOS device 102.

Embodiments of the disclosure provide various technical and commercial advantages, examples of which are discussed herein. The two-oxide layer arrangement disclosed herein prevents mirror layer (aluminum) creep and/or agglomeration during formation of the HTO layer and provides a suitable surface for LCOS assembly without using specialized alloys.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A reflective semiconductor device, comprising:
an integrated circuit (IC) structure;
a pair of mirror elements over the IC structure, the pair of mirror elements separated by a trench, each mirror element including:
a mirror layer on the IC structure, and
a low temperature oxide (LTO) layer on the mirror layer; and
a high temperature oxide (HTO) layer over the pair of mirror elements and filling the trench.

2. The reflective semiconductor device of claim 1, wherein the mirror layer consists essentially of aluminum.

3. The reflective semiconductor device of claim 1, wherein a surface of the HTO layer deviates no greater than 10 nanometers over the LTO layer versus in the trench between the pair of mirror elements.

4. The reflective semiconductor device of claim 1, wherein the mirror layer has a thickness of no greater than 50 nanometers, and the LTO layer and the HTO layer have a cumulative thickness of no greater than 100 nanometers over the mirror layer.

5. The reflective semiconductor device of claim 1, wherein the trench has a width of no greater than 100 nanometers.

6. The reflective semiconductor device of claim 1, wherein the LTO layer includes a silane-based silicon oxide ($SiO_2$), and the HTO layer includes a tetraethyl orthosilicate (TEOS) based silicon oxide ($SiO_2$).

7. The reflective semiconductor device of claim 1, wherein sidewalls of the LTO layer are aligned with sidewalls of the mirror layer, and the HTO layer abuts the sidewalls of the LTO layer and the mirror layer.

8. The reflective semiconductor device of claim 1, further comprising a liquid crystal layer disposed over the pair of mirror elements, and wherein the reflective semiconductor device is a liquid crystal on semiconductor (LCOS) device.

9. A reflective semiconductor device, comprising:
an integrated circuit (IC) structure;
a pair of mirror elements over the IC structure, the pair of mirror elements separated by a trench, each mirror element including:
an aluminum layer on the IC structure, and
a low temperature oxide (LTO) layer over the aluminum layer; and
a high temperature oxide (HTO) layer over the pair of mirror elements and filling the trench,
wherein sidewalls of the LTO layer are aligned with sidewalls of the aluminum layer, and the HTO layer abuts the sidewalls of the LTO layer and the aluminum layer, and
wherein a surface of the HTO layer deviates no greater than 10 nanometers over the LTO layer versus in the trench between the pair of mirror elements.

10. The reflective semiconductor device of claim 9, wherein the aluminum layer has a thickness of no greater than 50 nanometers, and the LTO layer and the HTO layer have a cumulative thickness of no greater than 100 nanometers over the aluminum layer.

11. The reflective semiconductor device of claim 9, wherein the trench has a width of no greater than 100 nanometers.

12. The reflective semiconductor device of claim 9, wherein the LTO layer includes a silane-based silicon oxide ($SiO_2$), and the HTO layer includes a tetraethyl orthosilicate (TEOS) based silicon oxide ($SiO_2$).

13. The reflective semiconductor device of claim 9, further comprising a liquid crystal layer disposed over the pair of mirror elements, and the reflective semiconductor device is a liquid crystal on semiconductor (LCOS) device.

* * * * *